(12) United States Patent
Ishii et al.

(10) Patent No.: US 7,015,583 B2
(45) Date of Patent: Mar. 21, 2006

(54) SUBMOUNT AND SEMICONDUCTOR DEVICE

(75) Inventors: Takashi Ishii, Itami (JP); Kenjiro Higaki, Itami (JP); Yasushi Tsuzuki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/512,828

(22) PCT Filed: Apr. 24, 2003

(86) PCT No.: PCT/JP03/05303

§ 371 (c)(1),
(2), (4) Date: Oct. 28, 2004

(87) PCT Pub. No.: WO03/094220

PCT Pub. Date: Nov. 13, 2003

(65) Prior Publication Data

US 2005/0167679 A1    Aug. 4, 2005

(30) Foreign Application Priority Data

Apr. 30, 2002 (JP) .............................. 2002-127948

(51) Int. Cl.
*H01L 23/48* (2006.01)
*H01L 23/152* (2006.01)
*H01L 29/40* (2006.01)

(52) U.S. Cl. ...................... 257/772; 257/232; 257/666; 257/676; 257/736

(58) Field of Classification Search ................ 257/772, 257/676, 666, 232, 735, 736, 373, 778, 780, 257/781

See application file for complete search history.

(56) References Cited

U.S. PATENT DOCUMENTS

| 5,770,821 | A | 6/1998 | Hikasa et al. | |
| 6,590,913 | B1 * | 7/2003 | Caras et al. | 372/36 |
| 2002/0149114 | A1 * | 10/2002 | Soga et al. | 257/772 |
| 2002/0181523 | A1 * | 12/2002 | Pinneo et al. | 372/43 |
| 2005/0067636 | A1 * | 3/2005 | Amoh et al. | 257/232 |

FOREIGN PATENT DOCUMENTS

| JP | 60-74539 A | 4/1985 |
| JP | 11-307692 A | 11/1999 |
| JP | 2000-328286 A | 11/2000 |

* cited by examiner

*Primary Examiner*—Amir Zarabian
*Assistant Examiner*—Seth Barnes
(74) *Attorney, Agent, or Firm*—McDermott Will & Emery LLP

(57) ABSTRACT

A submount can mount on it a semiconductor light-emitting device with high bonding strength, and a semiconductor unit incorporates the submount. The submount comprises (a) a submount substrate, (b) a solder layer formed at the top surface of the submount substrate, and (c) a solder intimate-contact layer that is formed between the submount substrate and the solder layer and that has a structure in which a transition element layer consisting mainly of at least one type of transition element and a precious metal layer consisting mainly of at least one type of precious metal are piled up. In the above structure, the transition element layer is formed at the submount-substrate side. The semiconductor unit is provided with a semiconductor light-emitting device mounted on the solder layer of the submount.

10 Claims, 4 Drawing Sheets

SUBMOUNT AND SEMICONDUCTOR DEVICE

TECHNICAL FIELD

The present invention relates to a submount and a semiconductor unit incorporating the submount, and particularly to a submount for mounting a semi-conductor light-emitting device on it and a semiconductor unit incorporating the submount. In the present invention, the term "semiconductor light-emitting device" is used to mean a device such as a laser diode or a light-emitting diode.

BACKGROUND ART

A semiconductor unit that is provided with a semiconductor light-emitting device is commonly known. Such a semiconductor unit is produced by mounting a semiconductor light-emitting device on a submount 3 as shown in FIG. 7. FIG. 7 is a schematic cross-sectional view explaining a method of producing a conventional semiconductor unit. A method of producing a conventional semi-conductor unit is explained below by referring to FIG. 7.

As shown in FIG. 7, in a method of producing a conventional semiconductor unit 1, first, a submount 3 for mounting a semiconductor light-emitting device 2 on it is prepared. The submount comprises:
  (a) a ceramic substrate 4;
  (b) multi-layer that is formed on the substrate and that is composed of a layer comprising titanium (Ti) and a layer comprising platinum (Pt) (Ti/Pt multi-layer 5);
  (c) a gold (Au) layer 6 that is formed on the multi-layer and that acts as an electrode layer;
  (d) a solder-protecting barrier layer 107 that is formed on the Au layer and that comprises platinum (Pt); and
  (e) a solder layer 8 that is formed on the barrier layer and that comprises gold (Au)-tin (Sn)-based solder.

The Ti/Pt multi-layer, the Au layer, the solder-protecting barrier layer, and the solder layer may be formed by using a conventional layer-forming process, such as an evaporation method, a sputtering method, or a plating method, or a patterning process, such as a photolithographic method or a metal mask method.

After the submount is prepared as shown in FIG. 7, the solder of the submount is heated and melted to mount a laser diode as a semiconductor light-emitting device on a predetermined position on the solder (a die-bonding step is performed). Then, the back side of the submount is securely bonded to a heat sink (not shown in the drawing) with solder or the like to complete the production of a semiconductor unit provided with a semiconductor light-emitting device.

To reduce the damage of the semiconductor light-emitting device caused by the heating during the die-bonding step of the device, lead (Pb)-tin (Sn)-based solder or silver (Ag)-tin (Sn)-based solder, both of which have a lower melting point than the gold-tin-based solder, is sometimes used for the solder layer. When the silver-tin-based solder is used, a lead-free production can be achieved at the same time.

In recent years, the increase in the writing rate of the CD unit and the DVD unit and the increase in the output of the laser-processing machine have been increasing the output of the semiconductor light-emitting device. The semiconductor unit to be used in those units and machine is required to have high reliability in use. To meet this requirement, it is necessary to increase the bonding strength between the semiconductor light-emitting device and the submount.

DISCLOSURE OF INVENTION

The present invention aims to meet the above-described requirement. An object of the present invention is to offer a submount capable of bonding a semiconductor light-emitting device to it with high strength and to offer a semiconductor unit incorporating the submount.

According to the present invention, the present invention offers a submount comprising:
  (a) a submount substrate;
  (b) a solder layer that:
    (b1) is formed at the top surface of the submount substrate; and
    (b2) is composed of lead-free solder; and
  (c) a solder intimate-contact layer that:
    (c1) is formed between the submount substrate and the solder layer;
    (c2) has a structure in which:
      (c2a) one precious metal layer consisting mainly of at least one type of precious metal is formed at the solder layer-side face; and
      (c2b) a transition element layer consisting mainly of at least one type of transition element is formed at the submount substrate-side face of the one precious metal layer such that the transition element layer makes surface contact with the one precious metal layer; and
    (c3) is formed such that the solder intimate-contact layer's face at the solder-layer side makes surface contact with the solder layer.

When a semiconductor light-emitting device is bonded to the solder layer, the submount has a bonding strength of at least 40 MPa with the semiconductor light-emitting device.

The submount having the above-described structure is provided with the solder intimate-contact layer directly below the solder layer to strengthen the bonding of the solder. As a result, the bonding strength between the semiconductor light-emitting device and the submount can be increased. The transition element layer may consist mainly of at least one element selected from the group consisting of the 4A-, 5A-, and 6A-group elements and their alloys. The transition element layer may also have a structure in which a plurality of layers having different compositions are piled up.

The submount having the above-described structure is provided with the solder intimate-contact layer directly below the solder layer to strengthen the bonding of the solder. As a result, the bonding strength between the semiconductor light-emitting device and the submount can be increased. The transition element layer may consist mainly of at least one element selected from the group consisting of the 4A-, 5A-, and 6A-group elements and their alloys. The transition element layer may also have a structure in which a plurality of layers having different compositions are piled up.

To increase the bonding strength and to reduce the cost, it is desirable that each of the transition element layer and the precious metal layer have a thickness of more than 0 and not more than 1 $\mu$m. It is more desirable that the transition element layer have a thickness of at least 0.01 $\mu$m and at most 0.2 $\mu$m and that the precious metal layer have a thickness of at least 0.01 $\mu$m and at most 0.1 $\mu$m.

It is desirable that the transition element layer consist mainly of at least one member selected from the group consisting of titanium (Ti), vanadium (V), chromium (Cr), zirconium (Zr), niobium (Nb), and their alloys. It is desirable that the precious metal layer consist mainly of at least one member selected from the group consisting of gold (Au), platinum (Pt), palladium (Pd), and their alloys. When these requirements are met, the bonding strength of the solder can be further increased.

It is desirable that the solder layer consist mainly of silver-tin-based solder. When this requirement is met, a lead-free production can be achieved. In addition, the bonding temperature of the semiconductor light-emitting device can be reduced, so that the damage of the semiconductor light-emitting device caused by the heating can be reduced.

Before it is melted, the solder layer may have a pile-up structure of a layer consisting mainly of silver and a layer consisting mainly of tin.

The submount may further comprise an electrode layer formed between the submount substrate and the solder intimate-contact layer. In this case, the electrode layer can also be used as an underlying layer of the solder intimate-contact layer.

The submount may further comprise between the submount substrate and the solder intimate-contact layer:
  (a) an intimate-contact layer formed such that it makes contact with the top surface of the submount substrate; and
  (b) an element diffusion-preventing layer formed on the intimate-contact layer.

In this case, the electrode layer is placed on the element diffusion-preventing layer.

The submount may have a structure in which:
  (a) the intimate-contact layer comprises titanium;
  (b) the element diffusion-preventing layer comprises platinum; and
  (c) the electrode layer comprises gold.

It is desirable that the submount substrate comprise an aluminum nitride-sintered body. When this requirement is met, a submount having superior heat-dissipating property can be produced because aluminum nitride has high thermal conductivity.

According to one aspect of the present invention, the present invention offers a semiconductor unit comprising:
  (a) any one of the submounts described above; and
  (b) a semiconductor light-emitting device mounted on the solder layer.

The semiconductor unit enables the bonding of a semiconductor light-emitting device to the submount with high strength, thereby improving the reliability of the semiconductor unit in use.

BEST MODE FOR CARRYING OUT THE INVENTION

Figure 1:
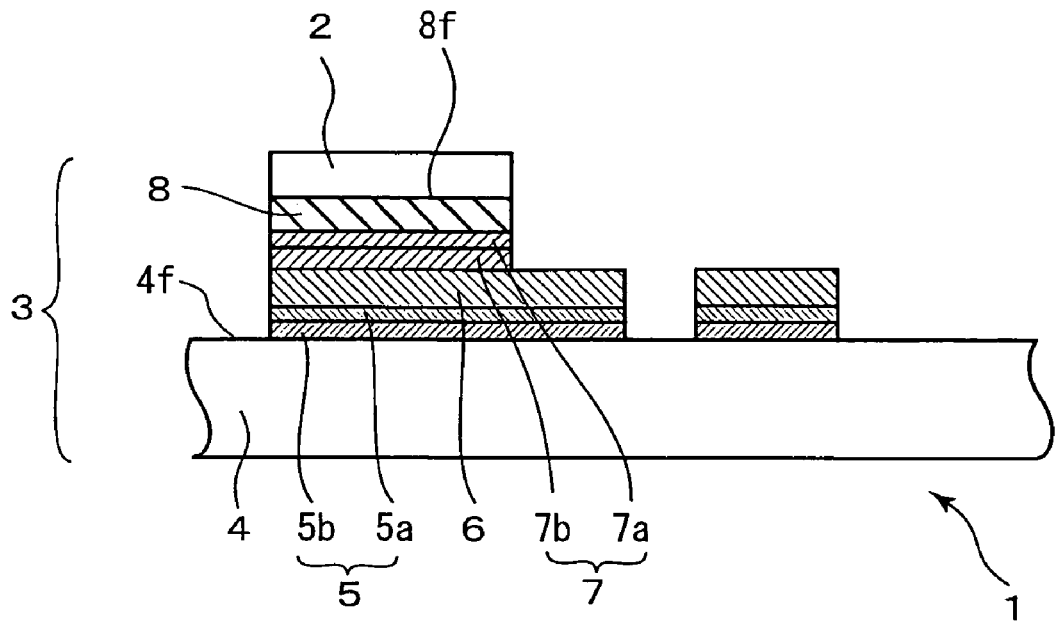
FIG. 1 is a schematic cross-sectional view showing an example of the embodiment of the semiconductor unit of the present invention.
Figure 2:
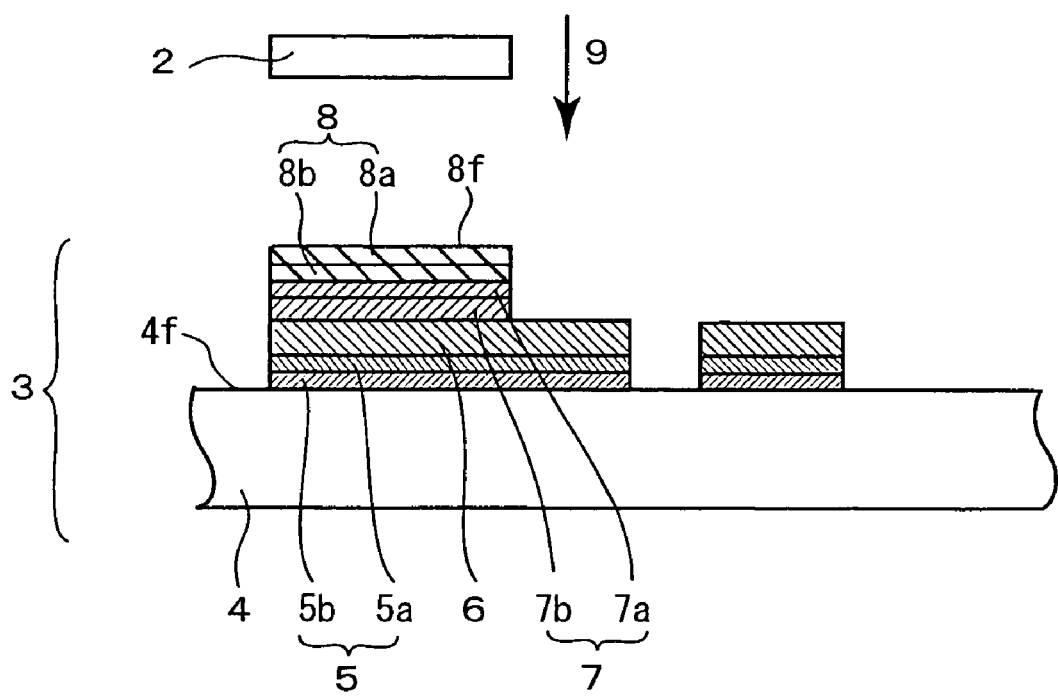
FIG. 2 is a schematic cross-sectional view explaining the method of producing the semiconductor unit shown in FIG. 1.
Figure 3:
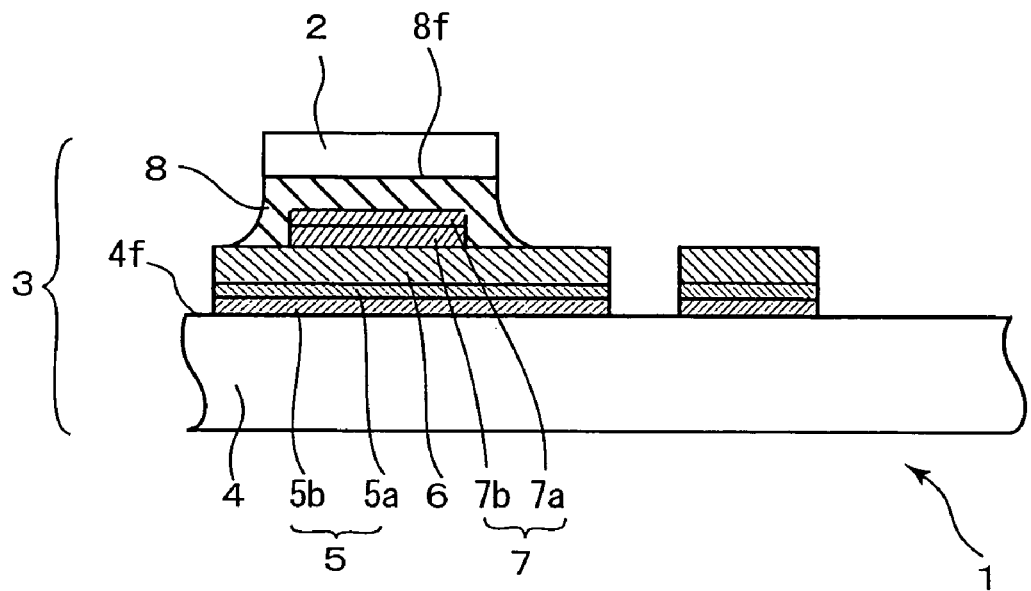
FIG. 3 is a schematic cross-sectional view showing another example of the embodiment of the semiconductor unit of the present invention.
Figure 4:
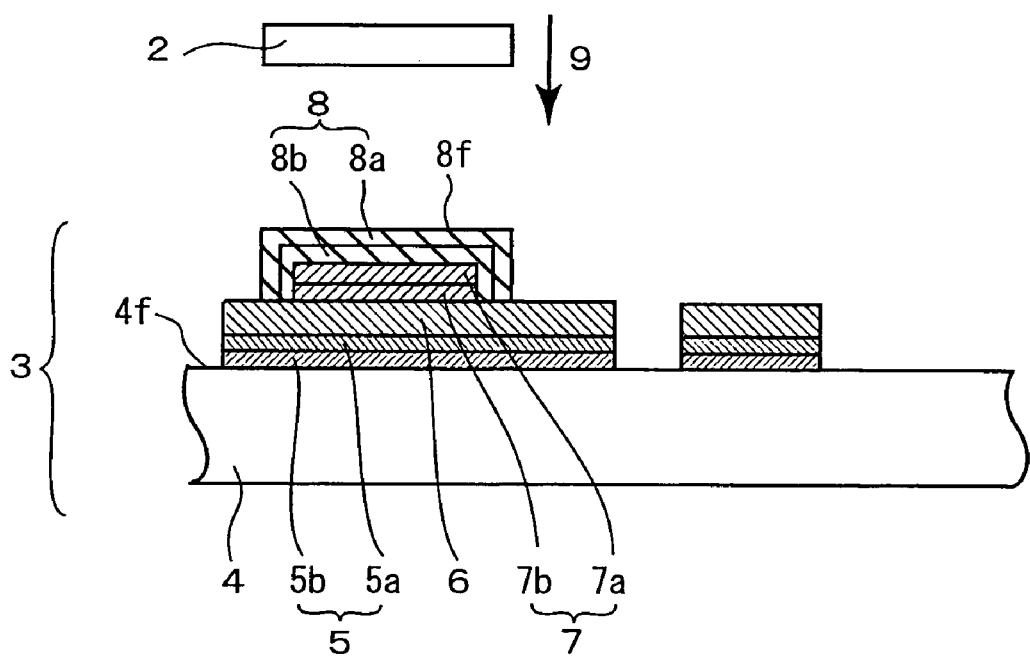
FIG. 4 is a schematic cross-sectional view explaining the method of producing the semiconductor unit shown in FIG. 3.
Figure 5:
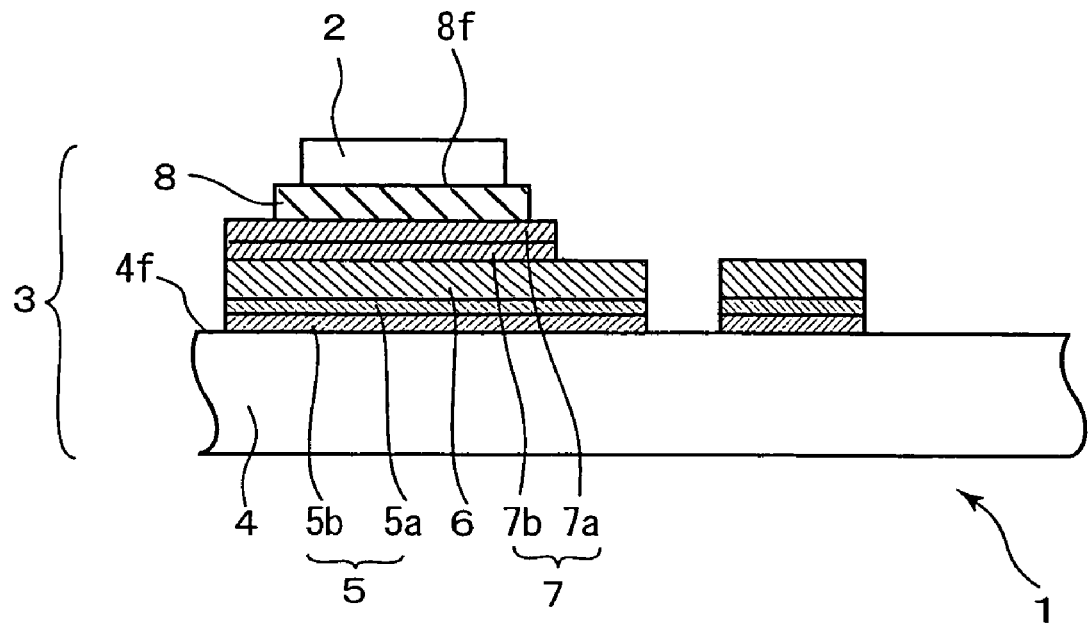
FIG. 5 is a schematic cross-sectional view showing yet another example of the embodiment of the semiconductor unit of the present invention.
Figure 6:
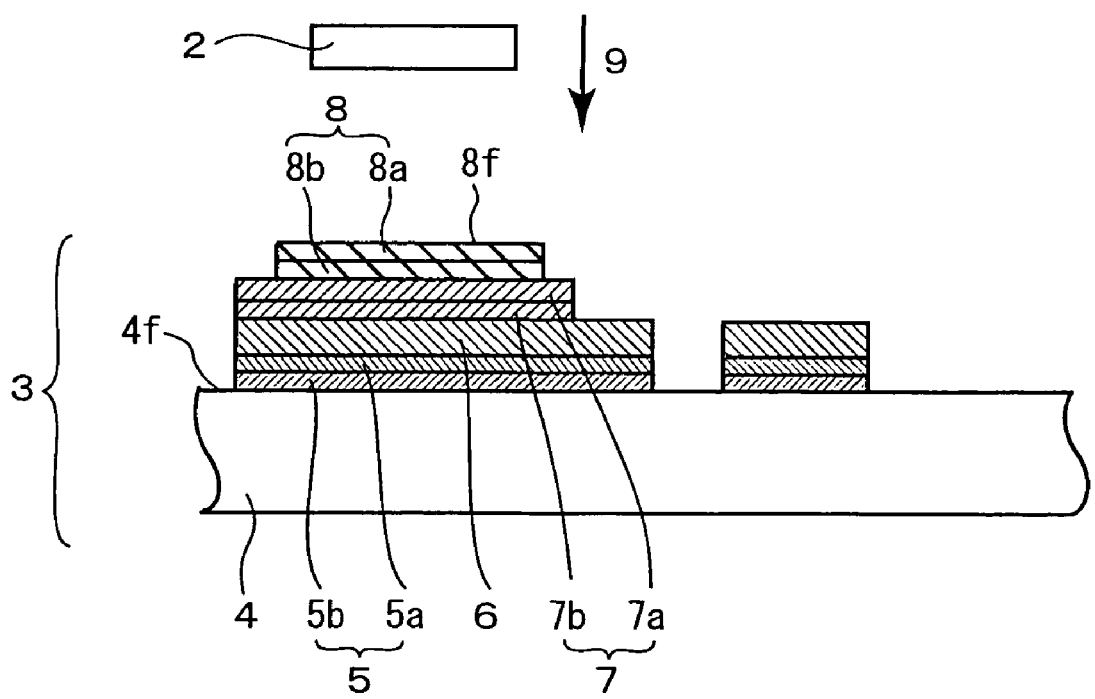
FIG. 6 is a schematic cross-sectional view explaining the method of producing the semiconductor unit shown in FIG. 5.
Figure 7:
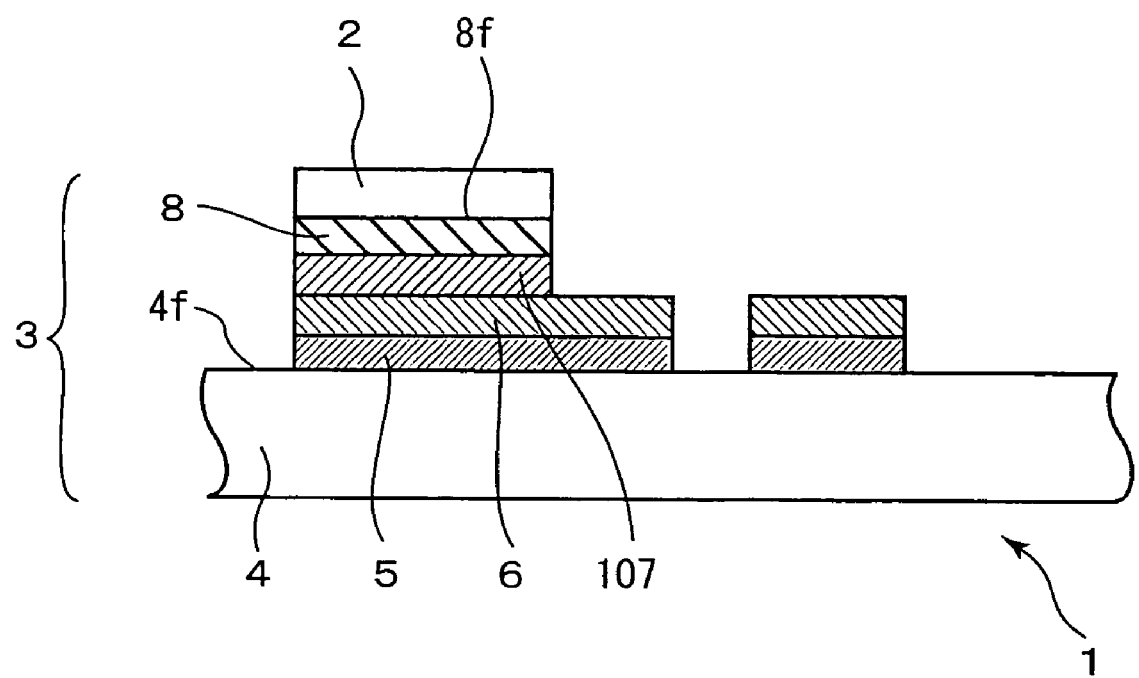
FIG. 7 is a schematic cross-sectional view explaining a method of producing a conventional semiconductor unit.

Embodiments of the present invention are explained below by referring to the drawing. FIGS. 1, 3, and 5 are schematic cross-sectional views showing examples of the embodiment of the semiconductor unit of the present invention. FIGS. 2, 4, and 6 are schematic cross-sectional views explaining the method of producing the semiconductor unit shown in FIGS. 1, 3, and 5, respectively. FIGS. 2, 4, and 6 show the semiconductor unit before the solder is melted. In the following drawing, the same or a similar item bears the same reference numeral to avoid duplicated explanations.

As shown in FIG. 1, a semiconductor unit 1 has a structure in which a laser diode 2 as a semiconductor light-emitting device is mounted on a submount 3. The submount comprises, for example:
  (a) a submount substrate 4 composed of an aluminum nitride (AlN) sintered body;
  (b) multi-layer 5 composed of a titanium (Ti) layer 5b as an intimate-contact layer and a platinum (Pt) layer 5a as an element diffusion-preventing layer (Ti/Pt multi-layer 5);
  (c) a gold (Au) layer 6 that is formed on the Ti/Pt multi-layer 5 and that acts as an electrode layer;
  (d) a solder intimate-contact layer 7 that is formed on the Au layer and that is composed of a titanium (Ti) layer 7b as a transition element layer and a platinum (Pt) layer 7a as a precious metal layer; and
  (e) a solder layer 8 that is formed on the solder intimate-contact layer and that is composed of silver-tin (AgSn)-based solder.

As shown in FIGS. 1 and 2, the laser diode is bonded to the submount through the solder layer. The widths of the laser diode, the solder layer, and the solder intimate-contact layer are nearly the same. As shown in FIGS. 3 to 6, before and after the solder is melted, the solder layer may have a width and a length either larger or smaller than those of the laser diode, and the solder intimate-contact layer may have a width and a length either larger or smaller than those of the solder layer.

In the semiconductor unit shown in FIG. 1, the substrate of the submount may be made of ceramic, semiconductor, or metal. The types of the ceramic include ceramics consisting mainly of the above-described aluminum nitride (AlN), aluminum oxide ($Al_2O_3$), silicon carbide (SiC), or silicon nitride ($Si_3N_4$). The types of the semiconductor include semiconductors consisting mainly of silicon (Si). The types of the metal include copper (Cu), tungsten (W), molybdenum (Mo), iron (Fe), alloys containing these, and composite materials such as a copper-tungsten (Cu—W) composite.

It is desirable that the substrate be made of a material having high thermal conductivity. It is desirable that the thermal conductivity be at least 100 W/mK, more desirably at least 170 W/mK. In addition, it is desirable that the substrate have a coefficient of thermal expansion comparable to that of the material of the laser diode. For example, when the laser diode is made of a material such as gallium arsenide (GaAs) or indium phosphide (InP), it is desirable that the substrate have a coefficient of thermal expansion of at most $10\times10^{-6}$/K, more desirably at most $5\times10^{-6}$/K.

When the substrate 4 is made of ceramic, the substrate may be provided with either a through hole that electrically connects a part of the top surface of the substrate 4 to the opposite portion in the back face or a via hole in which a conducting material (via fill) is filled for the same purpose. It is desirable that the conducting material (via fill) for filling the via hole consist mainly of a metal having a high melting point, particularly tungsten (W) or molybdenum (Mo). The above-described conducting material may also contain a transition metal such as titanium (Ti), a material for forming glass, or a material for forming the substrate such as aluminum nitride (AlN).

It is desirable that the substrate have a surface roughness, Ra, of at most 1 $\mu$m, more desirably at most 0.1 $\mu$m, and have a flatness of at most 5 $\mu$m, more desirably at most 1 $\mu$m. If the surface roughness Ra is more than 1 $\mu$m or the flatness is more than 5 $\mu$m, when the laser diode is bonded, gaps tend to be developed between the submount and the laser diode. The gaps sometimes reduce the effect of cooling the laser diode. The surface roughness Ra and the flatness are stipulated in JIS B 0601 and JIS B 0621, respectively (JIS is the abbreviation of the Japanese Industrial Standard).

The Ti layer, a layer comprising titanium (Ti), of the Ti/Pt multi-layer is an intimate-contact layer for increasing the intimate contactness with the substrate. The Ti layer is formed to make contact with the top surface of the substrate. The intimate-contact layer may be made of a material such as titanium (Ti), vanadium (V), chromium (Cr), nickel-chromium (NiCr) alloy, zirconium (Zr), niobium (Nb), tantalum (Ta), or a compound of these materials. When the substrate is made of metal, alloy, or a composite material containing metal, the intimate-contact layer may not be formed.

The platinum (Pt) layer of the Ti/Pt multi-layer is an element diffusion-preventing layer and is formed on the top surface of the Ti layer. The element diffusion-preventing layer may be made of a material such as platinum (Pt), palladium (Pd), nickel-chromium (NiCr) alloy, nickel (Ni), or molybdenum (Mo). The electrode layer usually consists mainly of Au.

A solder-protecting barrier layer may be formed between the solder intimate-contact layer and the electrode layer. The solder-protecting barrier layer may be made of a material such as platinum (Pt), nickel-chromium (NiCr) alloy, or nickel (Ni). The solder-protecting barrier layer may have a width and a length either larger or smaller than those of the solder intimate-contact layer.

In addition to the above-described silver-tin (AgSn)-based solder, the solder layer may be made of a material such as solder made of a metal having a low-melting point, such as tin (Sn) or indium (In), gold-tin (AuSn)-based solder, gold-germanium (AuGe)-based solder, indium-tin (InSn)-based solder, other alloy solder, or solder produced by combining these materials. In addition, the solder layer before the melting may have the form of a piling of different metals included in the above-described alloy solders as shown by the signs 8a and 8b in FIG. 2, for example. When the solder layer is made of silver-tin (AgSn)-based solder, it is desirable that the solder contain at least 0 wt % and at most 72 wt % silver (Ag). When the solder layer is made of gold-tin (AuSn)-based solder, it is desirable that the solder either contain at least 65 wt % and at most 85 wt % gold (Au) or contain at least 5 wt % and at most 20 wt % gold (Au).

Hereinafter the above-described Ti/Pt multi-layer, Au layer, solder intimate-contact layer, solder-protecting barrier layer, and solder layer are collectively referred to as a metallized layer. The metallized layer may be formed by using a conventional layer-forming method. For example, a thin-layer-forming process, such as an evaporation method and a sputtering method, or a plating process may be used.

The types of the patterning process for the above-described Ti/Pt multi-layer, Au layer, solder intimate-contact layer, and solder layer include a lift-off method incorporating photolithography, a chemical etching method, a dry etching method, and a metal mask method.

It is desirable that the titanium (Ti) layer of the Ti/Pt multi-layer have a thickness of at least 0.01 $\mu$m and at most 1.0 $\mu$m. It is desirable that the platinum (Pt) layer of the Ti/Pt multi-layer have a thickness of at least 0.01 $\mu$m and at most 1.5 $\mu$m. It is desirable that the Au layer as the electrode layer have a thickness of at least 0.1 $\mu$m and at most 10 $\mu$m. It is desirable that solder layer have a thickness of at least 0.1 $\mu$m and at most 10 $\mu$m. When a solder-protecting barrier layer is formed, it is desirable that it have a thickness of at least 0.01 $\mu$m and at most 1.5 $\mu$m.

In the present invention, the types of the material for the semiconductor light-emitting device include compound semiconductors such as GaAs, InP, and GaN. The light-emitting type may be either a face-up type or a face-down type. However, the face-down type laser diode has a structure in which the light-emitting portion is formed at a place closer to the back face, which makes contact with the solder layer. In this case, the light-emitting portion, which generates heat, is positioned at a place closer to the substrate. Therefore, this arrangement can further improve the heat-dissipating property of the semiconductor unit.

The laser diode is provided on its surface with an insulating layer, such as a silicon oxide ($SiO_2$) layer, and a metallized layer, such as an electrode layer. It is desirable that a gold (Au) layer as the electrode layer have a thickness of at least 0.1 $\mu$m and at most 10 $\mu$m in order to secure a good wettability with the solder layer.

The semiconductor unit shown in FIG. 1 may be bonded to a heat sink (not shown) by using solder or the like. More specifically, first, layers such as an intimate-contact layer and an element diffusion-preventing layer are formed on the substrate's face opposite to the face where the Ti/Pt multi-layer is formed. Then, sheet-shaped solder (solder foil) is placed between the back face of the substrate and the heat sink, for example. The heat sink is bonded with the submount through the solder. The solder foil may be formed on the metallized layer on the back face of the substrate in advance. In this case, the laser diode and the heat sink can be bonded to the substrate at the same time.

The heat sink may be made of a material such as metal or ceramic. The types of the metal include copper (Cu), aluminum (Al), tungsten (W), molybdenum (Mo), iron (Fe), their alloys, and composite materials composed of these materials. It is desirable to form on the surface of the heat sink a nickel (Ni) layer, a gold (Au) layer, or a layer containing the foregoing metal. These layers can be formed by the evaporation method and the plating method. It is desirable that the heat sink have a thermal conductivity as high as at least 100 W/mK.

Next, the method of producing the semiconductor unit shown in FIG. 1 is explained by referring to FIG. 2 and assuming that the substrate would be made of an aluminum nitride-sintered body.

The first step is the production of the substrate. This type of substrate has a length and a width as small as about several millimeters. Consequently, the substrate is usually produced by the following method. First, a substrate's base material having a length of about 50 mm and a width of about 50 mm, for example, is produced. A metallized layer is formed on the base material. Then, the base material is cut into tiny pieces having a specified size. The production method is explained below along this procedure. In this step, the substrate's base material is assumed to have a width of 50 mm, a length of 50 mm, and a thickness of 0.4 mm, as an example. The aluminum nitride (AlN)-sintered body to be used as the material for the substrate may be produced by using an ordinary method.

The second step is the lapping or polishing of the surface of the substrate. It is desirable that the lapped or polished substrate have a surface roughness, Ra, of at most 1.0 µm, more desirably at most 0.1 µm. The lapping or polishing operation may be performed by applying an ordinary method, such as the lapping with sandpaper or the polishing with abrasives. Alternatively, a grinding machine or the sandblasting may be employed.

The third step is to provide a pattern for forming with a specified pattern the Ti layer 5b as an intimate-contact layer, the Pt layer 5a as an element diffusion-preventing layer, and the Au layer 6 as an electrode layer all as shown in FIG. 2. In this patterning step, the other region than the region for forming the individual layers on the substrate is provided with a resist layer by using the photolithographic method, for example.

The fourth step is to vapor-deposit a Ti layer as the intimate-contact layer. The formed Ti layer has a thickness of 0.1 µm, for example.

The fifth step is to form a Pt layer as the element diffusion-preventing layer on the intimate-contact layer. The Pt layer has a thickness of 0.2 µm, for example.

The sixth step is to vapor-deposit an Au layer as the electrode layer. The Au layer has a thickness of 0.6 µm, for example.

The seventh step is a lift-off step. In this step, the resist layer formed in the third step, which is the patterning step, is removed with a resist-peeling liquid together with the portion of each of the intimate-contact layer, the element diffusion-preventing layer, and the electrode layer positioned on the resist layer. The removal can form the three layers having the specified pattern on the substrate.

The eighth step is to vapor-deposit the solder intimate-contact layer. In this step, the Ti layer 7b as the transition element layer is vapor-deposited on the electrode layer by using the metal mask method. Then, the Pt layer 7a as the precious metal layer is vapor-deposited on the Ti layer by the same method. The formed Ti and Pt layers have a thickness of 0.08 µm and 0.05 µm, respectively, for example.

In the step for forming the solder intimate-contact layer, in order to reduce the amount of impurity gases such as water vapor and oxygen in the layer-forming atmosphere, it is desirable that the chamber, before the layer formation is started, have a pressure (ultimate vacuum degree) of at most $5.0 \times 10^{-4}$ Pa, more desirably at most $1.0 \times 10^{-4}$ Pa. To increase the intimate contactness of the solder intimate-contact layer to the underlying layer, it is desirable that the surface temperature of the substrate at the time of the formation of the solder intimate-contact layer be from 20 to 350° C., more desirably from 100 to 250° C.

The ninth step is to form the solder layer 8 on the solder intimate-contact layer by the vacuum evaporation method. In this production method, as shown in FIG. 2, the Ag layer 8b of the Ag—Sn pile-up solder layer is vapor-deposited on the solder intimate-contact layer by using the metal mask method. Then, the Sn layer 8b is vapor-deposited on the Ag layer 8b by the same method. The formed Ag and Sn layers have a thickness of 1.5 µm and 3.0 µm, respectively, for example.

In the step for forming the solder layer, in order to reduce the amount of impurity gases such as water vapor and oxygen in the layer-forming atmosphere, it is desirable that the chamber, before the layer formation is started, have a pressure (ultimate vacuum degree) of at most $5.0 \times 10^{-4}$ Pa, more desirably at most $1.0 \times 10^{-4}$ Pa. To increase the intimate contactness of the solder layer to the solder intimate-contact layer, it is desirable that the surface temperature of the substrate at the time of the formation of the solder layer be at least 20° C. and not higher than the temperature 10° C. below the liquid phase-generating temperature of the solder.

The solder intimate-contact layer and the solder layer both having a specified pattern may be formed by the photolithographic method described earlier in place of the foregoing metal mask method.

The tenth step is to cut the substrate's base material processed as described above into submounts having a specific length and a width. Thus, the submount 3 shown in FIG. 2 is obtained.

The eleventh step is to bond the laser diode 2 as a semiconductor light-emitting device to the submount. More specifically, first, the solder layer 8 is melted by heating. Then, as shown in FIG. 2, the laser diode is placed on the molten solder layer 8 as shown by an arrow 9, so that the laser diode is bonded to the submount through the solder layer. This completes the production of the semiconductor unit 1 shown in FIG. 1.

As described above, the submount and semiconductor unit of the present invention are provided with the solder intimate-contact layer directly below the solder layer. The solder intimate-contact layer has a structure in which the transition element layer, which strengthens the bonding with the solder, and the precious metal layer are piled up. Therefore, the bonding strength between the semiconductor light-emitting device and the submount can be further increased. As a result, the reliability of the semiconductor unit in practical use can be further improved.

EXAMPLE (Production of Samples and their Evaluation)

As shown in Table 1, submounts denoted as Samples 1 to 29 were produced by the below-described procedure. Samples 1 to 25 were produced as Examples, and Samples 26 to 29 were produced as Comparative examples.

First, substrates made of materials shown in Table 1 were prepared. They all had a width of 50 mm, a length of 50 mm, and a thickness of 0.4 mm. The surface of the substrates was polished to cause the top surface 4f to have a surface roughness, Ra, of 0.05 µm. Operations using the lift-off method incorporating photolithography and the vacuum evaporation method formed a metallized layer comprising the Ti layer 5b having a thickness of 0.1 µm, the Pt layer 5a of 0.2 µm, and the Au layer 6 of 0.6 µm. In Sample 7, the foregoing metallized layer was replaced with a metallized layer comprising an Ni-plated layer having a thickness of 1.0 µm and an Au-plated layer having a thickness of 1.0 µm.

Next, the solder intimate-contact layer 7 comprising the transition element layer and the precious metal layer was formed on the metallized layer by using the metal mask and vacuum evaporation methods. Table 1 shows the composition and thickness of the transition element layer and the precious metal layer and the condition of the vacuum evaporation.

All Samples were provided with the solder layer 8 by using the metal mask and vacuum evaporation methods. The composition and thickness of the solder layer and the condition of the vacuum evaporation are shown in Table 1.

In Table 1, "composition ratio of solder" shows the weight ratio of the elements constituting the solder layer.

Ten submounts having a width of 1.2 mm, a length of 1.5 mm, and a thickness of 0.3 mm were obtained for each of Samples 1 to 29 by cutting the substrate 4. The laser diode 2 was bonded to each of the sample submounts by heating the solder layer in an nitrogen atmosphere to melt it. The bonding temperature is shown in Table 1.

The semiconductor unit 1 thus obtained (see FIG. 1) was subjected to the test for measuring the bonding strength of the laser diode to the submount. The test was performed according to the die shear strength test stipulated in MIL-STD-883C Method 2019.4. The test result was evaluated by averaging 10 data of the bonding strength for each of Samples 1 to 29. The results are also shown in Table 1.

Table 1 shows that the submount and semiconductor unit of the present invention have a bonding strength between the semiconductor light-emitting device and the submount higher than that of Comparative examples.

It is to be understood that the above-described embodiments and examples are illustrative and not restrictive in all respects. The scope of the present invention is shown by the scope of the appended claims, not by the above-described embodiments and examples. Accordingly, the present invention is intended to cover all modifications included within the meaning and scope equivalent to the scope of the claims.

TABLE 1

| | | Solder intimate-contact layer | | | | | |
|---|---|---|---|---|---|---|---|
| | | Transition element layer | | Precious metal layer | | Condition of vacuum evaporation | |
| Sample No. | Substrate | Composition | Layer thickness ($\mu$m) | Composition | Layer thickness ($\mu$m) | Vacuum degree ($\times 10^{-5}$ Pa) | Substrate temperature (° C.) |
| 1 | AlN sintered body | Ti | 0.06 | Pt | 0.05 | 8.0 | 230 |
| 2 | AlN sintered body | Ti | 0.06 | Au | 0.05 | 8.0 | 230 |
| 3 | AlN sintered body | V | 0.06 | Pd | 0.05 | 8.0 | 230 |
| 4 | AlN sintered body | Cr | 0.06 | Pt | 0.05 | 8.0 | 230 |
| 5 | SiC sintered body | Zr | 0.06 | Au | 0.05 | 8.0 | 230 |
| 6 | Al$_2$O$_3$ sintered body | Nb | 0.06 | Pt | 0.05 | 8.0 | 230 |
| 7 | Cu—W | Ti | 0.06 | Pt | 0.05 | 8.0 | 230 |
| 8 | AlN sintered body | Ti | 0.06 | Pt | 0.05 | 8.0 | 230 |
| 9 | AlN sintered body | Ti | 0.06 | Pt | 0.05 | 8.0 | 230 |
| 10 | AlN sintered body | Ti | 0.06 | Pt | 0.05 | 8.0 | 230 |
| 11 | AlN sintered body | Ti | 0.008 | Pt | 0.05 | 8.0 | 230 |
| 12 | AlN sintered body | Ti | 0.1 | Pt | 0.05 | 8.0 | 230 |
| 13 | AlN sintered body | Ti | 0.5 | Pt | 0.05 | 8.0 | 230 |
| 14 | AlN sintered body | Ti | 0.06 | Pt | 0.008 | 8.0 | 230 |
| 15 | AlN sintered body | Ti | 0.06 | Pt | 0.2 | 8.0 | 230 |
| 16 | AlN sintered body | Ti | 0.06 | Pt | 0.5 | 8.0 | 230 |
| 17 | AlN sintered body | Ti | 0.06 | Pt | 0.05 | 15.0 | 230 |
| 18 | AlN sintered body | Ti | 0.06 | Pt | 0.05 | 40.0 | 230 |
| 19 | AlN sintered body | Ti | 0.06 | Pt | 0.05 | 8.0 | 230 |
| 20 | AlN sintered body | Ti | 0.06 | Pt | 0.05 | 8.0 | 230 |
| 21 | AlN sintered body | Ti | 0.06 | Pt | 0.05 | 8.0 | 50 |
| 22 | AlN sintered body | Ti | 0.06 | Pt | 0.05 | 8.0 | 150 |
| 23 | AlN sintered body | Ti | 0.06 | Pt | 0.05 | 8.0 | 300 |
| 24 | AlN sintered body | Ti | 0.06 | Pt | 0.05 | 8.0 | 230 |
| 25 | AlN sintered body | Ti | 0.06 | Pt | 0.05 | 8.0 | 230 |
| *26 | AlN sintered body | Ti | 0.06 | — | — | 8.0 | 230 |
| *27 | AlN sintered body | — | — | — | — | — | — |
| *28 | AlN sintered body | — | — | Pt | 0.05 | 8.0 | 230 |
| *29 | AlN sintered body | — | — | Pt | 0.05 | 8.0 | 230 |

| | Solder layer | | | | | |
|---|---|---|---|---|---|---|
| | Composition ratio of | | Condition of vacuum evaporation | | Laser diode | |
| Sample No | solder (weight ratio) | Layer thickness ($\mu$m) | Vacuum degree ($\times 10^{-5}$ Pa) | Substrate temperature (° C.) | Bonding temperature (° C.) | Bonding strength (MPa) |
| 1 | Ag:Sn = 32:68 | 1.5/4.0(Ag/Sn piling) | 8.0 | 150 | 250 | 52 |
| 2 | Ag:Sn = 32:68 | 1.5/4.0(Ag/Sn piling) | 8.0 | 150 | 250 | 49 |
| 3 | Ag:Sn = 32:68 | 1.5/4.0(Ag/Sn piling) | 8.0 | 150 | 250 | 45 |
| 4 | Ag:Sn = 32:68 | 1.5/4.0(Ag/Sn piling) | 8.0 | 150 | 250 | 46 |
| 5 | Ag:Sn = 32:68 | 1.5/4.0(Ag/Sn piling) | 8.0 | 150 | 250 | 47 |
| 6 | Ag:Sn = 32:68 | 1.5/4.0(Ag/Sn piling) | 8.0 | 150 | 250 | 48 |
| 7 | Ag:Sn = 32:68 | 1.5/4.0(Ag/Sn piling) | 8.0 | 150 | 250 | 47 |
| 8 | Au:Sn = 80:20 | 3.5 | 8.0 | 150 | 290 | 43 |
| 9 | Au:Sn = 10:90 | 3.5 | 8.0 | 150 | 250 | 42 |
| 10 | Au:Sn = 10:90 | 3.5 | 8.0 | 150 | 250 | 51 |
| 11 | Ag:Sn = 32:68 | 1.5/4.0(Ag/Sn piling) | 8.0 | 150 | 250 | 43 |
| 12 | Ag:Sn = 32:68 | 1.5/4.0(Ag/Sn piling) | 8.0 | 150 | 250 | 50 |
| 13 | Ag:Sn = 32:68 | 1.5/4.0(Ag/Sn piling) | 8.0 | 150 | 250 | 48 |
| 14 | Ag:Sn = 32:68 | 1.5/4.0(Ag/Sn piling) | 8.0 | 150 | 250 | 44 |

TABLE 1-continued

| | | | | | | |
|---|---|---|---|---|---|---|
| 15 | Ag:Sn = 32:68 | 1.5/4.0(Ag/Sn piling) | 8.0 | 150 | 250 | 48 |
| 16 | Ag:Sn = 32:68 | 1.5/4.0(Ag/Sn piling) | 8.0 | 150 | 250 | 47 |
| 17 | Ag:Sn = 32:68 | 1.5/4.0(Ag/Sn piling) | 8.0 | 150 | 250 | 41 |
| 18 | Ag:Sn = 32:68 | 1.5/4.0(Ag/Sn piling) | 8.0 | 150 | 250 | 40 |
| 19 | Ag:Sn = 32:68 | 1.5/4.0(Ag/Sn piling) | 15.0 | 150 | 250 | 42 |
| 20 | Ag:Sn = 32:68 | 1.5/4.0(Ag/Sn piling) | 40.0 | 150 | 250 | 40 |
| 21 | Ag:Sn = 32:68 | 1.5/4.0(Ag/Sn piling) | 8.0 | 150 | 250 | 44 |
| 22 | Ag:Sn = 32:68 | 1.5/4.0(Ag/Sn piling) | 8.0 | 150 | 250 | 49 |
| 23 | Ag:Sn = 32:68 | 1.5/4.0(Ag/Sn piling) | 8.0 | 150 | 250 | 45 |
| 24 | Ag:Sn = 32:68 | 1.5/4.0(Ag/Sn piling) | 8.0 | 50 | 250 | 47 |
| 25 | Ag:Sn = 32:68 | 1.5/4.0(Ag/Sn piling) | 8.0 | 200 | 250 | 49 |
| *26 | Ag:Sn = 32:68 | 1.5/4.0(Ag/Sn piling) | 8.0 | 150 | 250 | 30 |
| *27 | Au:Sn = 80:20 | 3.5 | 8.0 | 150 | 290 | 30 |
| *28 | Au:Sn = 80:20 | 3.5 | 8.0 | 150 | 290 | 32 |
| *29 | Ag:Sn = 32:68 | 1.5/4.0(Ag/Sn piling) | 8.0 | 150 | 250 | 31 |

Note:
*Comparative example
Vacuum degree: ultimate vacuum degree before the vacuum evaporation of solder intimate-contact layer and solder layer

INDUSTRIAL APPLICABILITY

As explained above, the present invention provides the solder intimate-contact layer directly below the solder layer. The solder intimate-contact layer has a structure in which the transition element layer, which strengthens the bonding with the solder, and the precious metal layer are piled up. Therefore, the bonding strength between the semiconductor light-emitting device and the submount can be further increased. As a result, the reliability of the semiconductor unit in practical use can be further improved.

The invention claimed is:

1. A submount, comprising:
(a) a submount substrate;
(b) a solder layer that:
(b1) is formed at the top surface of the submount substrate; and
(b2) is composed of lead-free solder; and
(c) a solder intimate-contact layer that:
(c1) is formed between the submount substrate and the solder layer;
(c2) has a structure in which:
(c2a) one precious metal layer consisting mainly of at least one type of precious metal is formed at the solder layer-side face; and
(c2b) a transition element layer consisting mainly of at least one type of transition element is formed at the submount substrate-side face of the one precious metal layer such that the transition element layer makes surface contact with the one precious metal layer; and
(c3) is formed such that the solder intimate-contact layer's face at the solder-layer side makes surface contact with the solder layer; the submount, when a semiconductor light-emitting device is bonded to the solder layer, having a bonding strength of at least 40 MPa with the semiconductor light-emitting device.

2. A submount as defined by claim 1, wherein each of the transition element layer and the precious metal layer has a thickness of more than 0 and not more than 1 $\mu$m.

3. A submount as defined by claim 1, wherein:
(a) the transition element layer consists mainly of at least one member selected from the group consisting of titanium, vanadium, chromium, zirconium, niobium, and their alloys; and (b) the precious metal layer consists mainly of at least one member selected from the group consisting of gold, platinum, palladium, and their alloys.

4. A submount as defined by claim 1, wherein the solder layer consists mainly of silver-tin-based solder.

5. A submount as defined by claim 4, wherein the solder layer, before it is melted, has a pile-up structure of a layer consisting mainly of silver and a layer consisting mainly of tin.

6. A submount as defined by claim 1, the submount further comprising an electrode layer formed between the submount substrate and the solder intimate-contact layer.

7. A submount as defined by claim 6, the submount further comprising between the submount substrate and the solder intimate-contact layer:
(a) an intimate-contact layer formed such that it makes contact with the top surface of the submount substrate; and
(b) an element diffusion-preventing layer formed on the intimate-contact layer;
the electrode layer being placed on the element diffusion-preventing layer.

8. A submount as defined by claim 7, wherein:
(a) the intimate-contact layer comprises titanium;
(b) the element diffusion-preventing layer comprises platinum; and
(c) the electrode layer comprises gold.

9. A submount as defined by claim 1, wherein the submount substrate comprises an aluminum nitride-sintered body.

10. A semiconductor unit comprising:
(a) a submount that comprises:
(a1) a submount substrate;
(a2) a solder layer that:
(a2a) is formed at the top surface of the submount substrate; and
(a2b) is composed of lead-free solder; and
(a3) a solder intimate-contact layer that:
(a3a) is formed between the submount substrate and the solder layer;
(a3b) has a structure in which:
(a3b1) one precious metal layer consisting mainly of at least one type of precious metal is formed at the solder layer-side face; and (a3b2) a transition element layer consisting mainly of at least one type of transition element is formed at the submount substrate-side face of the one precious metal layer such that the transition element layer makes surface contact with the one precious metal layer; and (a3c) is formed such that the solder intimate-contact layer's face at the solder-layer side makes surface contact with the solder layer;

the submount, when a semiconductor light-emitting device is bonded to the solder layer having a bonding strength of at least 40 MPa with the semiconductor light-emitting device; and (b) a semiconductor light-emitting device mounted on the solder layer.

\* \* \* \* \*